United States Patent
Hiratsuka et al.

(10) Patent No.: US 9,627,487 B2
(45) Date of Patent: Apr. 18, 2017

(54) METHOD FOR MANUFACTURING SILICON CARBIDE SEMICONDUCTOR DEVICE AND SILICON CARBIDE SEMICONDUCTOR DEVICE

(71) Applicant: Sumitomo Electric Industries, Ltd., Osaka-shi (JP)

(72) Inventors: Kenji Hiratsuka, Osaka (JP); Yu Saitoh, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/784,560

(22) PCT Filed: Mar. 5, 2014

(86) PCT No.: PCT/JP2014/055565
§ 371 (c)(1),
(2) Date: Oct. 14, 2015

(87) PCT Pub. No.: WO2014/171210
PCT Pub. Date: Oct. 23, 2014

(65) Prior Publication Data
US 2016/0064490 A1    Mar. 3, 2016

(30) Foreign Application Priority Data
Apr. 16, 2013   (JP) .................... 2013-085734

(51) Int. Cl.
*H01L 29/16*   (2006.01)
*H01L 21/3065*   (2006.01)
(Continued)

(52) U.S. Cl.
CPC .... *H01L 29/1608* (2013.01); *H01L 21/02238* (2013.01); *H01L 21/02255* (2013.01);
(Continued)

(58) Field of Classification Search
CPC ......... H01L 21/02238; H01L 21/02255; H01L 21/0475; H01L 21/049; H01L 21/3065;
(Continued)

(56) References Cited

U.S. PATENT DOCUMENTS 5,915,180 A   6/1999   Hara et al.
6,262,439 B1 *  7/2001   Takeuchi ............ H01L 21/0485
257/331

(Continued)

FOREIGN PATENT DOCUMENTS

JP   07-326755 A   12/1995
JP   2002-299619 A   10/2002
(Continued)

OTHER PUBLICATIONS

International Search Report in International Application No. PCT/JP2014/055565, dated May 20, 2014.

*Primary Examiner* — Allan R Wilson
(74) *Attorney, Agent, or Firm* — Venable LLP; Michael A. Santori

(57) ABSTRACT

A silicon carbide substrate has first to third semiconductor layers. The first and third semiconductor layers have a first conductivity type, and the second semiconductor layer has a second conductivity type. A trench has a bottom surface and first to third side surfaces, the bottom surface being constituted of the first semiconductor layer, the first to third side surfaces being respectively constituted of the first to third semiconductor layers. A gate insulating film having a bottom portion and a side wall portion is provided on the trench. The bottom portion has a minimum thickness $d_0$. A portion of the side wall portion on the second side surface has a minimum thickness $d_1$. A portion, connected to the bottom portion, of the side wall portion on the first side surface has a thickness $d_2$. Moreover, $d_2 > d_1$ and $d_2 > d_0$ are satisfied.

5 Claims, 13 Drawing Sheets

(51) Int. Cl.
  *H01L 29/423* (2006.01)
  *H01L 29/66* (2006.01)
  *H01L 29/78* (2006.01)
  *H01L 21/02* (2006.01)
  *H01L 21/04* (2006.01)
  *H01L 21/308* (2006.01)
  *H01L 21/311* (2006.01)
  *H01L 29/739* (2006.01)
  *H01L 29/04* (2006.01)

(52) U.S. Cl.
  CPC ........ *H01L 21/049* (2013.01); *H01L 21/0475* (2013.01); *H01L 21/3065* (2013.01); *H01L 21/3081* (2013.01); *H01L 21/31111* (2013.01); *H01L 29/4236* (2013.01); *H01L 29/66068* (2013.01); *H01L 29/7397* (2013.01); *H01L 29/7813* (2013.01); *H01L 29/045* (2013.01)

(58) Field of Classification Search
  CPC ........... H01L 21/3081; H01L 21/31111; H01L 29/1608; H01L 29/4236; H01L 29/42368; H01L 29/66068; H01L 29/7397; H01L 29/7813
  See application file for complete search history.

(56) References Cited

U.S. PATENT DOCUMENTS

| | | | |
|---|---|---|---|
| 8,748,977 B2* | 6/2014 | Kudou | H01L 29/4236 257/329 |
| 2001/0023961 A1 | 9/2001 | Hshieh et al. | |
| 2001/0026961 A1 | 10/2001 | Williams et al. | |
| 2002/0153558 A1 | 10/2002 | Takemori et al. | |
| 2003/0089946 A1 | 5/2003 | Hshieh et al. | |
| 2004/0188756 A1 | 9/2004 | Matsuda | |
| 2005/0014384 A1* | 1/2005 | Cho | H01L 21/76807 438/720 |
| 2006/0091456 A1 | 5/2006 | Montgomery | |
| 2007/0290260 A1 | 12/2007 | Adan | |
| 2010/0059816 A1 | 3/2010 | Shimada et al. | |
| 2010/0193799 A1* | 8/2010 | Nakano | H01L 29/1608 257/77 |
| 2012/0037983 A1 | 2/2012 | Hshieh | |
| 2012/0292693 A1 | 11/2012 | Lee et al. | |
| 2013/0306982 A1* | 11/2013 | Kudou | H01L 29/4236 257/76 |
| 2015/0048382 A1* | 2/2015 | Takeuchi | H01L 29/4236 257/77 |
| 2016/0049485 A1* | 2/2016 | Saitoh | H01L 21/02236 438/589 |

FOREIGN PATENT DOCUMENTS

| | | |
|---|---|---|
| JP | 2003-509836 A | 3/2003 |
| JP | 2004-500716 A | 1/2004 |
| JP | 2004-342863 | 2/2004 |
| JP | 2004-303802 A | 10/2004 |
| JP | 2005-019668 A | 1/2005 |
| JP | 2005-510087 A | 4/2005 |
| JP | 2006-344760 A | 12/2006 |
| JP | 2008-519436 A | 6/2008 |
| JP | 2009-088188 A | 4/2009 |
| JP | 2011-216651 A | 10/2011 |
| JP | 2012-216675 A | 11/2012 |

* cited by examiner

METHOD FOR MANUFACTURING SILICON CARBIDE SEMICONDUCTOR DEVICE AND SILICON CARBIDE SEMICONDUCTOR DEVICE

TECHNICAL FIELD

The present invention relates to a method for manufacturing a silicon carbide semiconductor device and the silicon carbide semiconductor device, in particular, a method for manufacturing a silicon carbide semiconductor device having a trench and the silicon carbide semiconductor device.

BACKGROUND ART

As a silicon carbide semiconductor device, Japanese Patent Laying-Open No. 7-326755 (Patent Document 1) discloses a trench gate type MOSFET (Metal Oxide Semiconductor Field Effect Transistor) employing a silicon carbide substrate, for example. According to this publication, in order to prevent dielectric breakdown of a gate oxide film at the bottom portion of a trench, the thickness of the gate thermal oxidation film at the bottom portion is made thicker than the thickness thereof at the side portion.

CITATION LIST

Patent Document

PTD 1: Japanese Patent Laying-Open No. 7-326755

SUMMARY OF INVENTION

Technical Problem

When the bottom portion of the gate oxide film is simply made thick as described above, a depletion layer is further extended from the bottom surface of the trench into the semiconductor layer, thus resulting in a narrowed current path in the semiconductor layer. Accordingly, the on resistance of the silicon carbide semiconductor device becomes large.

The present invention has been made to solve the problem described above, and has an object to provide a method for manufacturing a silicon carbide semiconductor device and the silicon carbide semiconductor device so as to reduce on resistance while preventing dielectric breakdown.

Solution to Problem

A method for manufacturing a silicon carbide semiconductor device in the present invention includes the following steps.

There is prepared a silicon carbide substrate including a first semiconductor layer, a second semiconductor layer, and a third semiconductor layer, the first semiconductor layer having a first conductivity type, the second semiconductor layer being provided on the first semiconductor layer, the second semiconductor layer having a second conductivity type, the third semiconductor layer being provided on the second semiconductor layer, the third semiconductor layer being separated from the first semiconductor layer by the second semiconductor layer, the third semiconductor layer having the first conductivity type.

A trench is formed in the silicon carbide substrate. The trench includes a bottom surface and a side wall surface, the bottom surface being constituted of the first semiconductor layer, the side wall surface having first to third side surfaces respectively constituted of the first to third semiconductor layers. The trench has a corner portion formed by the first side surface and the bottom surface meeting each other.

A gate insulating film is formed on the trench. The gate insulating film has a bottom portion and a side wall portion, the bottom portion covering the bottom surface, the side wall portion being connected to the bottom portion, the side wall portion covering the side wall surface. The bottom portion has a minimum thickness $d_0$. A portion of the side wall portion on the second side surface has a minimum thickness $d_1$. The side wall portion has a portion that is connected to the bottom portion on the first side surface and that has a thickness $d_2$. Moreover, $d_2 > d_1$ and $d_2 > d_0$ are satisfied. The step of forming the gate insulating film includes steps of forming a corner insulating film to cover the corner portion and at least partially expose the second side surface of the trench and thermally oxidizing the trench after forming the corner insulating film.

A gate electrode is formed on the trench with the gate insulating film being interposed therebetween.

A silicon carbide semiconductor device of the present invention includes a silicon carbide substrate, a gate insulating film, and a gate electrode.

The silicon carbide substrate includes a first semiconductor layer, a second semiconductor layer, and a third semiconductor layer, the first semiconductor layer having a first conductivity type, the second semiconductor layer being provided on the first semiconductor layer, the second semiconductor layer having a second conductivity type, the third semiconductor layer being provided on the second semiconductor layer, the third semiconductor layer being separated from the first semiconductor layer by the second semiconductor layer, the third semiconductor layer having the first conductivity type. The silicon carbide substrate is provided with a trench. The trench includes a bottom surface and a side wall surface, the bottom surface being constituted of the first semiconductor layer, the side wall surface having first to third side surfaces respectively constituted of the first to third semiconductor layers.

The gate insulating film is provided on the trench. The gate insulating film has a bottom portion and a side wall portion, the bottom portion covering the bottom surface, the side wall portion being connected to the bottom portion, the side wall portion covering the side wall surface. The bottom portion has a minimum thickness $d_0$. A portion of the side wall portion on the second side surface has a minimum thickness $d_1$. The side wall portion has a portion that is connected to the bottom portion on the first side surface and that has a thickness $d_2$. Moreover, $d_2 > d_1$ and $d_2 > d_0$ are satisfied.

The gate electrode is provided on the trench with the gate insulating film being interposed therebetween.

Advantageous Effects of Invention

According to the present invention, on resistance can be reduced while preventing dielectric breakdown.

DESCRIPTION OF EMBODIMENTS

Figure 1:
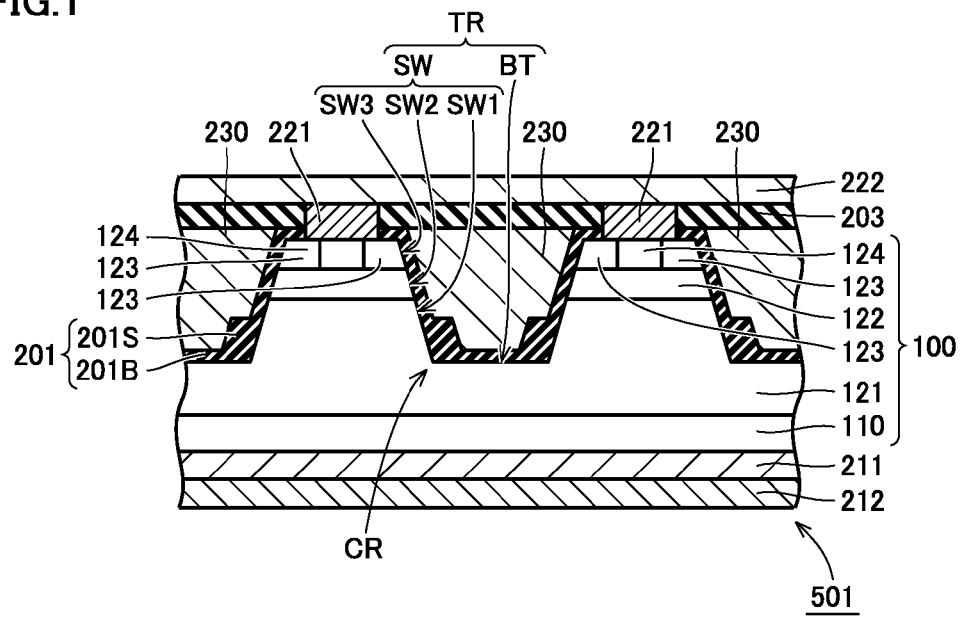
FIG. 1 is a partial cross sectional view schematically showing a configuration of a silicon carbide semiconductor device in a first embodiment of the present invention.

The following describes embodiments of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

First, the overview of the embodiments will be described with regard to (i) to (xiv) as follows.

(i) A method for manufacturing a silicon carbide semiconductor device 501, 502 includes the following steps.

There is prepared a silicon carbide substrate 100 including a first semiconductor layer 121, a second semiconductor layer 122, and a third semiconductor layer 123, first semiconductor layer 121 having a first conductivity type, second semiconductor layer 122 being provided on first semiconductor layer 121, second semiconductor layer 122 having a second conductivity type, third semiconductor layer 123 being provided on second semiconductor layer 122, third semiconductor layer 123 being separated from first semiconductor layer 121 by second semiconductor layer 122, third semiconductor layer 123 having the first conductivity type.

A trench TR is formed in silicon carbide substrate 100. Trench TR includes a bottom surface BT and a side wall surface SW, bottom surface BT being constituted of first semiconductor layer 121, side wall surface SW having first to third side surfaces SW1 to SW3 respectively constituted of first to third semiconductor layers 121 to 123. Trench TR has a corner portion CR formed by first side surface SW1 and bottom surface BT meeting each other.

A gate insulating film 201 is formed on trench TR. Gate insulating film 201 has a bottom portion 201B and a side wall portion 201S, bottom portion 201B covering bottom surface BT, side wall portion 201S being connected to bottom portion 201B, side wall portion 201S covering side wall surface SW. Bottom portion 201B has a minimum thickness $d_0$. A portion of side wall portion 201S on second side surface SW2 has a minimum thickness $d_1$. Side wall portion 201S has a portion that is connected to bottom portion 201B on first side surface SW1 and that has a thickness $d_2$. Moreover, $d_2 > d_1$ and $d_2 > d_0$ are satisfied. The step of forming gate insulating film 201 includes steps of forming a corner insulating film 201R to cover corner portion CR and at least partially expose second side surface SW2 of trench TR and thermally oxidizing trench TR after forming corner insulating film 201R.

A gate electrode 230 is formed on trench TR with gate insulating film 201 being interposed therebetween.

According to this manufacturing method, by forming corner insulating film 201R, gate insulating film 201 satisfying $d_2>d_1$ and $d_2>d_0$ is obtained. With $d_2>d_1$, it is possible to control the gate at a low voltage and prevent dielectric breakdown of gate insulating film 201 in the vicinity of corner portion CR of trench TR. Furthermore, with $d_2>d_0$, bottom portion 201B of gate insulating film 201 has a portion thinner than thickness $d_2$, thereby suppressing the depletion layer from extending from bottom surface BT of trench TR to first semiconductor layer 121. Thus, a degree of narrowing the current path in first semiconductor layer 121 by this depletion layer can be reduced. This leads to a small on resistance of silicon carbide semiconductor device 501, 502.

(ii) In (i), the step of forming corner insulating film 201R preferably includes steps of: forming a covering insulating film 251, 252 to cover trench TR; and etching back covering insulating film 251, 252.

Accordingly, corner insulating film 201R can be formed readily.

(iii) In (ii), the step of etching back covering insulating film 251, 252 is preferably performed by wet etching.

Accordingly, the etch back is performed by chemical etching rather than physical etching. Therefore, the etch back does not provide physical damage to silicon carbide substrate 100.

(iv) In (ii) or (iii), the step of forming covering insulating film 251 may include the following steps.

A first insulating film 201P is formed on trench TR. After the step of forming first insulating film 201P, a second insulating film 202 is formed to cover a portion of first insulating film 201P on corner portion CR and at least partially expose a portion of first insulating film 201P on the second side surface SW2.

Accordingly, there is formed covering insulating film 251 having a portion that is likely to remain as corner insulating film 201R after etch back.

(v) In (iv), the step of forming second insulating film 202 may include the following steps.

After the step of forming first insulating film 201P, a silicon film 302 is formed to cover a portion of first insulating film 201P on corner portion CR and at least partially expose a portion of first insulating film 201P on second side surface SW2. Silicon film 302 is oxidized.

Accordingly, second insulating film 202 of covering insulating film 251 can be formed from silicon film 302.

(vi) In (v), the step of forming silicon film 302 may include the following steps.

A deposited film 302P is formed to cover trench. TR by depositing silicon. A resist layer 402 is formed by applying a resist liquid to fill trench TR with deposited film 302P being interposed therebetween. Resist layer 402 is patterned by etching back resist layer 402 such that resist layer 402 partially remains in trench TR. Deposited film 302P is etched using resist layer 402 as a mask after patterning resist layer 402.

Accordingly, silicon film 302 to serve as second insulating film 202 can be patterned readily.

(vii) In (ii) or (iii), covering insulating film 252 may have a bottom portion 252B and a side wall portion 252S, bottom portion 252B being located on bottom surface BT, side wall portion 252S being located on side wall surface SW so as to be connected to bottom portion 252B. The step of forming covering insulating film 252 may be performed by forming a thermal oxidation film on trench TR such that side wall portion 252S has a maximum thickness at a location connected to bottom portion 252B.

Accordingly, there is formed covering insulating film 252 having a portion that is likely to remain as corner insulating film 201R after etch back.

(viii) In (vii), the thermal oxidation film may be formed by thermal oxidation at a temperature of less than 1300° C.

Accordingly, covering insulating film 252 having a portion that is likely to remain as corner insulating film 201R after etch back can be formed readily using thermal oxidation.

(ix) A silicon carbide semiconductor device 501, 502 includes a silicon carbide substrate 100, a gate insulating film 201, and a gate electrode 230.

Silicon carbide substrate 100 includes a first semiconductor layer 121, a second semiconductor layer 122, and a third semiconductor layer 123, first semiconductor layer 121 having a first conductivity type, second semiconductor layer 122 being provided on first semiconductor layer 121, second semiconductor layer 122 having a second conductivity type, third semiconductor layer 123 being provided on second semiconductor layer 122, third semiconductor layer 123 being separated from first semiconductor layer 121 by second semiconductor layer 122, third semiconductor layer 123 having the first conductivity type. Silicon carbide substrate 100 is provided with a trench TR. Trench TR includes a bottom surface BT and a side wall surface SW, bottom surface BT being constituted of first semiconductor layer 121, side wall surface SW having first to third side surfaces SW1 to SW3 respectively constituted of first to third semiconductor layers 121 to 123.

Gate insulating film 201 is provided on trench TR. Gate insulating film 201 has a bottom portion 201B and a side wall portion 201S, bottom portion 201B covering bottom surface BT, side wall portion 201S being connected to bottom portion 201B, side wall portion 201S covering side wall surface SW. Bottom portion 201B has a minimum thickness $d_0$. A portion of side wall portion 201S on second side surface SW2 has a minimum thickness $d_1$. Side wall portion 201S has a portion that is connected to bottom portion 201B on first side surface SW1 and that has a thickness $d_2$. Moreover, $d_2>d_1$ and $d_2>d_0$ are satisfied.

Gate electrode 230 is provided on trench TR with gate insulating film 201 being interposed therebetween.

According to silicon carbide semiconductor device 501, 502, gate insulating film 201 satisfies $d_2>d_1$ and $d_2>d_0$. With $d_2>d_1$, it is possible to control the gate at a low voltage and prevent dielectric breakdown of gate insulating film 201 in the vicinity of corner portion CR of trench TR. Furthermore, with $d_2>d_0$, bottom portion 201B of gate insulating film 201 has a portion thinner than thickness $d_2$, thereby suppressing the depletion layer from extending from bottom surface BT of trench TR to first semiconductor layer 121. Thus, a degree of narrowing the current path in first semiconductor layer 121 by this depletion layer can be reduced. This leads to a small on resistance of silicon carbide semiconductor device 501, 502.

(x) In (ix), $d_0>d_1$ is preferably satisfied.

Accordingly, bottom portion 201B of gate insulating film 201 does not have a portion formed to be too thin. Therefore, the dielectric breakdown of gate insulating film 201 can be prevented more securely.

(xi) In (ix) or (x), side wall portion 201S of gate insulating film 201 preferably connects first semiconductor layer 121 and third semiconductor layer 123 to each other on second side surface SW2 by a portion having a thickness less than thickness $d_2$.

Accordingly, first semiconductor layer 121 and third semiconductor layer 123 are connected to each other by a channel path facing gate electrode 230 with only a portion of gate insulating film 201 having a thickness less than thickness $d_2$ being interposed therebetween. Therefore, gate voltage necessary for gate control can be made lower.

(xii) In (ix) to (xi), side wall portion 201S of gate insulating film 201 preferably connects first semiconductor layer 121 and third semiconductor layer 123 to each other on second side surface SW2 by the portion having thickness $d_1$.

Accordingly, first semiconductor layer 121 and third semiconductor layer 123 are connected to each other by the channel path facing gate electrode 230 with only a portion of gate insulating film 201 having thickness $d_1$ being interposed therebetween. Therefore, gate voltage necessary for gate control can be made lower.

(xiii) In (ix) to (xii), side wall portion 201S of gate insulating film 201 preferably connects between second semiconductor layer 122 and bottom portion 201B on first side surface SW1 by a portion having a thickness more than thickness $d_1$.

Accordingly, the portion of side wall portion 201S on first side surface SW1 has a thickness more than thickness $d_1$ in a wider range. Therefore, the dielectric breakdown of gate insulating film 201 can be prevented more securely in the vicinity of corner portion CR of trench TR.

(xiv) In (ix) to (xiii), side wall portion 201S of gate insulating film 201 preferably connects between second semiconductor layer 122 and bottom portion 201B on first side surface SW1 by the portion having thickness $d_2$.

Accordingly, the portion of side wall portion 201S on first side surface SW1 has a thickness $d_2$ more than each of thicknesses $d_0$ and $d_1$ in a wider range. Therefore, the dielectric breakdown of gate insulating film 201 can be prevented more securely in the vicinity of corner portion CR of trench TR.

Next, as more detailed description, the following describes first to third embodiments and supplementary matters thereof.

First Embodiment

As shown in FIG. 1, a MOSFET 501 (silicon carbide semiconductor device) of the present embodiment includes an epitaxial substrate 100 (silicon carbide substrate), gate insulating films 201, gate electrodes 230, interlayer insulating films 203, source electrodes 221, a drain electrode 211, a source interconnection 222, and a protecting electrode 212.

Epitaxial substrate 100 is made of silicon carbide, and has a single-crystal substrate 110 and an epitaxial layer provided thereon. Single-crystal substrate 110 has n type conductivity (first conductivity type). The plane orientation (hklm) of one main surface (upper surface in FIG. 1) of single-crystal substrate 110 preferably has m of negative value, more preferably, is approximately a (000-1) plane.

Figure 2:
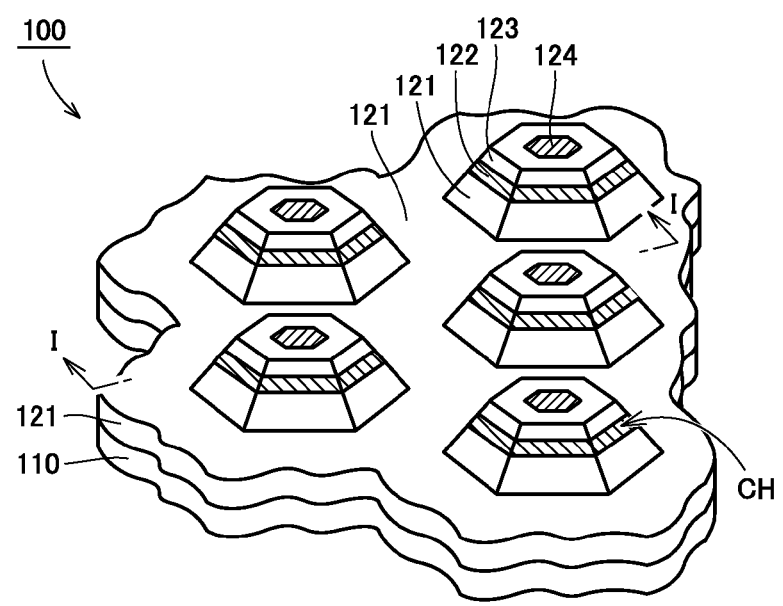
FIG. 2 is a perspective view schematically showing the shape of a silicon carbide substrate included in the silicon carbide semiconductor device of FIG. 1 with hatching being provided to a region of second conductivity type for viewability of the figure.

Further, with reference to FIG. 2, the epitaxial layer of epitaxial substrate 100 includes an n$^-$ layer 121 (first semiconductor layer), a p type body layer 122 (second semiconductor layer), an n region 123 (third semiconductor layer), and a contact region 124. The silicon carbide of epitaxial substrate 100 preferably has a hexagonal crystal structure, more preferably, has polytype of 4H.

N$^-$ layer 121 has a donor added therein, and therefore has n type conductivity. The donor is preferably added to n$^-$ layer 121 by adding an impurity during epitaxial growth of n$^-$ layer 121, rather than ion implantation. N$^-$ layer 121 preferably has a donor concentration lower than that of single-crystal substrate 110. The donor concentration of n$^-$ layer 121 is preferably not less than $1 \times 10^{15}$ cm$^{-3}$ and not more than $5 \times 10^{16}$ cm$^{-3}$, for example, $8 \times 10^{15}$ cm$^{-3}$.

Each of p type body layers 122 is provided on n$^-$ layer 121, has an acceptor added therein, and therefore has p type conductivity (second conductivity type different from the first conductivity type). P type body layer 122 has an acceptor concentration of, for example, $1 \times 10^{18}$ cm$^{-3}$.

Each of n regions 123 has n type conductivity. N region 123 is provided on p type body layer 122, and is separated from n$^-$ layer 121 by p type body layer 122.

Each of contact regions 124 has p type conductivity. Contact region 124 is formed on a portion of p type body layer 122 so as to be connected to p type body layer 122.

Figure 3:
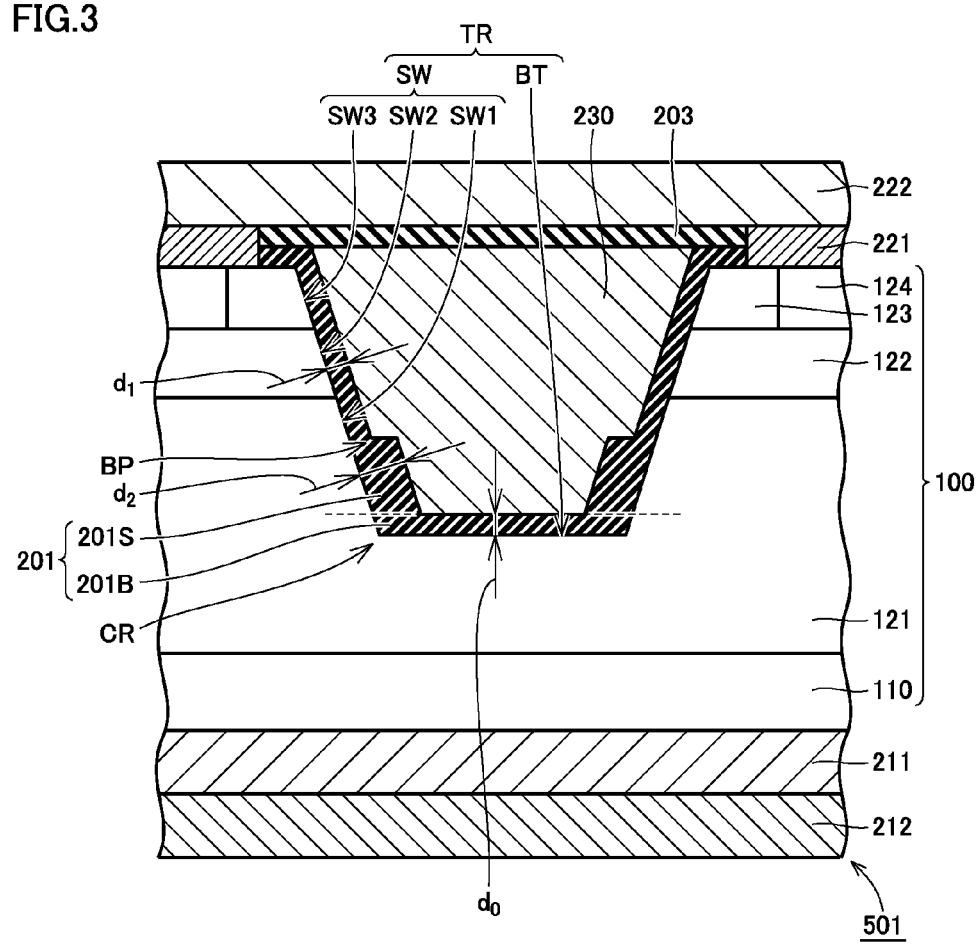
FIG. 3 is an enlarged view of FIG. 1.

With reference to FIG. 3, a trench TR is provided in the epitaxial layer of epitaxial substrate 100. Trench TR includes: a bottom surface BT constituted of n$^-$ layer 121; and a side wall surface SW having side surfaces SW1 to SW3 (first to third side surfaces). Side surfaces SW1 to SW3 are respectively constituted of n$^-$ layer 121, p type body layer 122, and n region 123. Bottom surface BT is a flat surface substantially parallel to the main surface of epitaxial substrate 100. Trench TR has a corner portion CR formed by side surface SW1 and bottom surface BT meeting each other. Side surface SW2 has a function as a channel of the MOSFET. Preferably, side wall surface SW, in particular, side surface SW2 has a predetermined crystal plane (also referred to as "special plane"). Details of the special plane will be described later.

The fact that epitaxial substrate 100 has trench TR corresponds to such a fact that the epitaxial layer is partially removed above the upper surface of single-crystal substrate 110. In the present embodiment, a multiplicity of mesa structures are formed on the upper surface of single-crystal substrate 110. Specifically, each of the mesa structures has upper surface and bottom surface both having a hexagonal shape, and has side walls inclined relative to the upper surface of single-crystal substrate 110. Accordingly, trench TR is expanded toward the opening side.

Gate insulating film 201 is provided on trench TR. Gate insulating film 201 separates epitaxial substrate 100 and gate electrode 230 from each other in trench TR. Gate insulating film 201 is preferably an oxide film, such as a silicon oxide film.

Gate insulating film 201 includes: a bottom portion 201B covering bottom surface BT; and a side wall portion 201S connected to bottom portion 201B and covering side wall surface SW. Bottom portion 201B has a minimum thickness $d_0$. A portion of side wall portion 201S on side surface SW2 has a minimum thickness $d_1$. Side wall portion 201S has a portion that is connected to bottom portion 201B on side surface SW1 and that has a thickness $d_2$. In the present embodiment, the portion having thickness $d_1$ and the portion having thickness $d_2$ are connected to each other at a boundary portion BP, which is a region in which a thickness is changed. In the present embodiment, boundary portion BP is located deeper (downward in the figure) than a boundary between side surfaces SW1 and SW2.

Regarding the above-described thicknesses, $d_2 > d_1$ and $d_2 > d_0$ are satisfied. Preferably, $d_0 > d_1$ is satisfied. Preferably, side wall portion 201S connects n$^-$ layer 121 and n region 123 to each other on side surface SW2 by a portion having a thickness less than thickness $d_2$. Preferably, side wall portion 201S connects n$^-$ layer 121 and n region 123 to each other on side surface SW2 by the portion having thickness $d_1$.

Gate electrode 230 is provided on trench TR with gate insulating film 201 being interposed therebetween. Namely, gate electrode 230 faces each of side surfaces SW1 to SW3 and bottom surface BT with gate insulating film 201 being interposed therebetween.

Source electrode 221 extends through interlayer insulating film 203 and is in contact with each of n region 123 and contact region 124. Source interconnection 222 is provided on source electrode 221 and interlayer insulating film 203 in contact with source electrode 221. Drain electrode 211 is provided on an opposite surface of epitaxial substrate 100 to its surface provided with trench TR. Protecting electrode 212 covers drain electrode 211.

Next, the following describes a method for manufacturing MOSFET 501 (FIG. 1).

Figure 4:
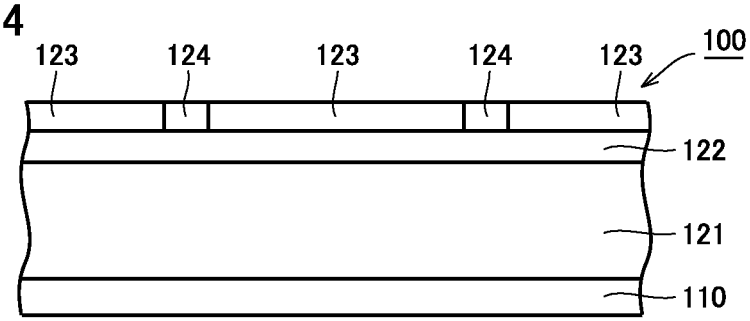
FIG. 4 is a partial cross sectional view schematically showing a first step of a method for manufacturing the silicon carbide semiconductor device of FIG. 1.

With reference to FIG. 4, n⁻ layer 121 is formed by epitaxial growth on single-crystal substrate 110. This epitaxial growth can be achieved by employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. Moreover, in this case, it is preferable to introduce nitrogen (N) and phosphorus (P) as donors, for example.

Next, p type body layer 122 is formed on n⁻ layer 121, and n region 123 is formed on p type body layer 122. Specifically, ions are implanted into the upper surface of n⁻ layer 121. In the ion implantation for forming p type body layer 122, ions of an acceptor such as aluminum (Al) are implanted. Meanwhile, in the ion implantation for forming n region 123, ions of a donor such as phosphorus (P) are implanted, for example. It should be noted that instead of the ion implantation, epitaxial growth involving addition of an impurity may be employed. Next, contact region 124 is formed by ion implantation.

Next, an activation heating treatment is performed to activate the impurities added by the ion implantation. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere. In this way, epitaxial substrate 100 is prepared.

Figure 5:
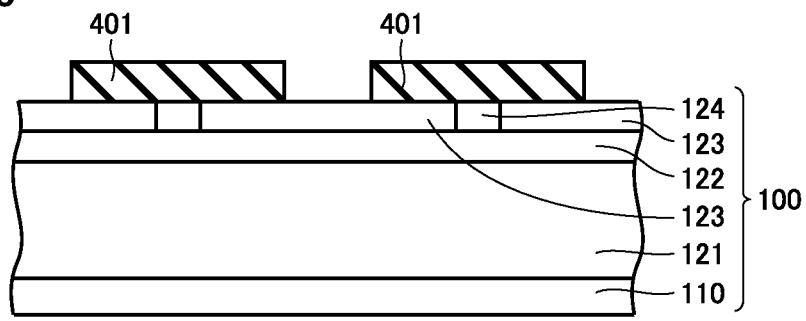
FIG. 5 is a partial cross sectional view schematically showing a second step of the method for manufacturing the silicon carbide semiconductor device of FIG. 1.

As shown in FIG. 5, a mask 401 having an opening partially exposing n region 123 is formed on epitaxial substrate 100. The opening is disposed in conformity with the position of trench TR (FIG. 1). As mask 401, a silicon oxide film formed by thermal oxidation can be used, for example.

Figure 6:
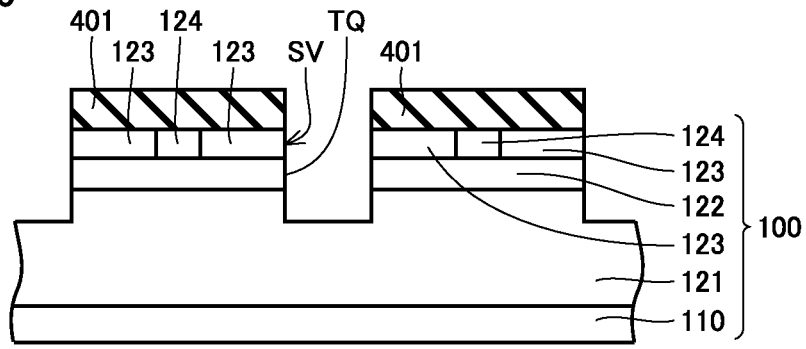
FIG. 6 is a partial cross sectional view schematically showing a third step of the method for manufacturing the silicon carbide semiconductor device of FIG. 1.

As shown in FIG. 6, in the opening of mask 401, n region 123, p type body layer 122, and portions of n⁻ layer 121 are removed by etching. An exemplary, usable etching method is reactive ion etching (RIE), in particular, inductively coupled plasma (ICP) RIE. Specifically, for example, ICP-RIE can be employed using $SF_6$ or a mixed gas of $SF_6$ and $O_2$ as a reactive gas. By means of such etching, in the region where trench TR (FIG. 1) is to be formed, a recess TQ can be formed which has a side wall having an inner surface SV substantially perpendicular to the main surface of single-crystal substrate 110.

Next, epitaxial substrate 100 is etched using mask 401. Specifically, inner surface SV of recess TQ of epitaxial substrate 100 is thermally etched. The thermal etching can be performed by, for example, heating epitaxial substrate 100 in an atmosphere containing a reactive gas having at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C. It should be noted that the reactive gas may include carrier gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 μm/hour. In addition, in this case, mask 401, which is formed of silicon oxide and therefore has a very large selection ratio relative to SiC, is not substantially etched during the etching of SIC.

Figure 7:
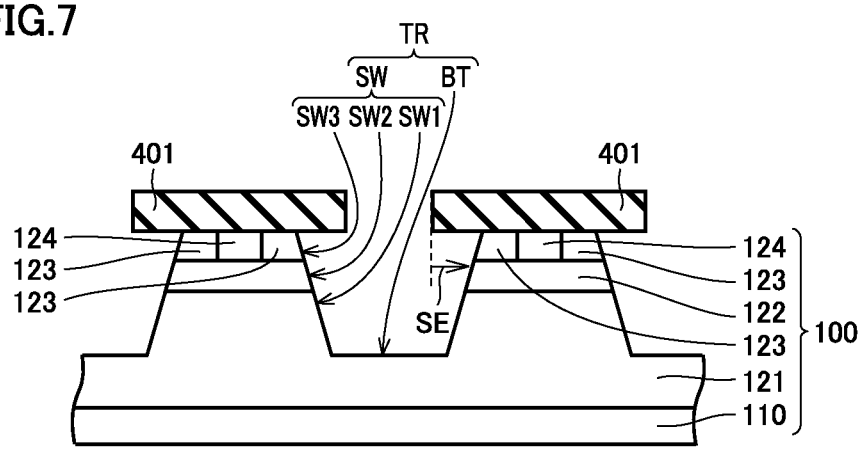
FIG. 7 is a partial cross sectional view schematically showing a fourth step of the method for manufacturing the silicon carbide semiconductor device of FIG. 1.
Figure 8:
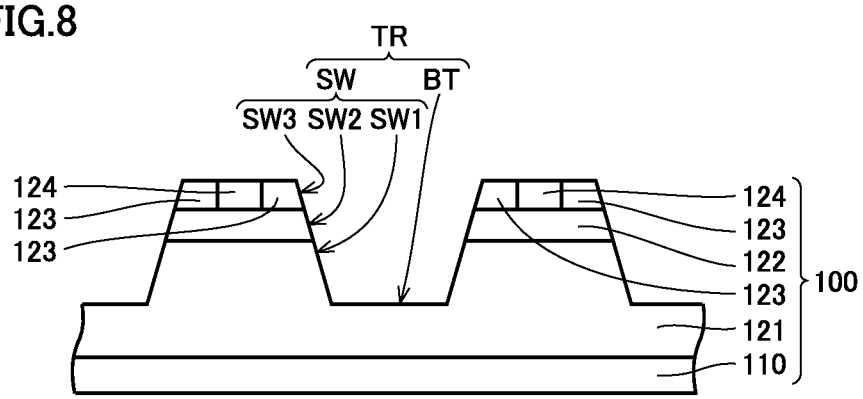
FIG. 8 is a partial cross sectional view schematically showing a fifth step of the method for manufacturing the silicon carbide semiconductor device of FIG. 1.

As shown in FIG. 7, trench TR is formed in the epitaxial layer of silicon carbide substrate 100 by the above-mentioned thermal etching. During the formation of trench TR, epitaxial substrate 100 is side-etched from the opening of mask 401 as indicated by an arrow SE. Further, during this thermal etching, a special plane is spontaneously formed on side wall surface SW of trench TR, in particular, on side surface SW2. Next, mask 401 is removed by wet etching, for example (FIG. 8). The wet etching can be performed using hydrofluoric acid, for example.

Figure 9:
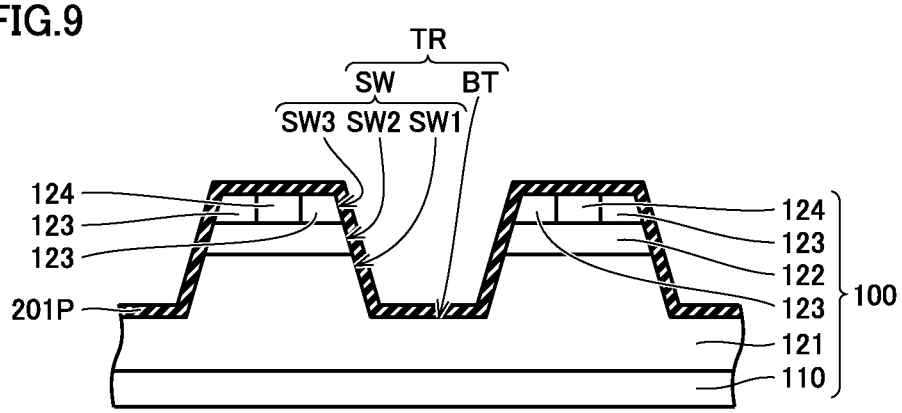
FIG. 9 is a partial cross sectional view schematically showing a sixth step of the method for manufacturing the silicon carbide semiconductor device of FIG. 1.

As shown in FIG. 9, a lower insulating film 201P (first insulating film) is formed on trench TR. Lower insulating film 201P covers each of side surfaces SW1 to SW3 and bottom surface BT of trench TR. Lower insulating film 201P is preferably formed through thermal oxidation of epitaxial substrate 100.

Figure 10:
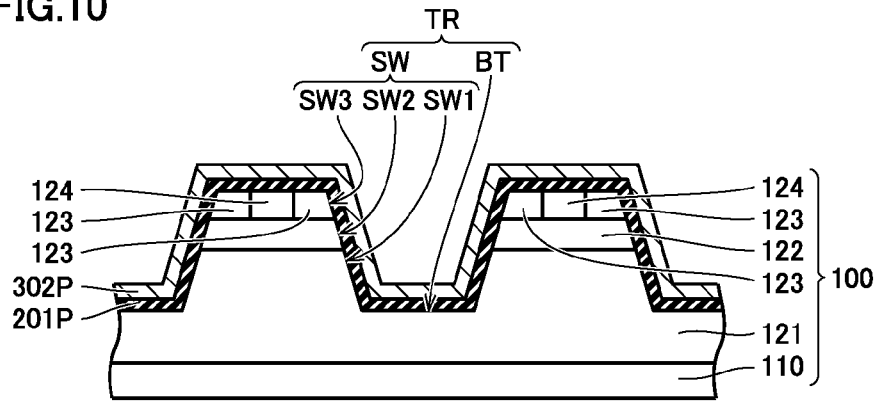
FIG. 10 is a partial cross sectional view schematically showing a seventh step of the method for manufacturing the silicon carbide semiconductor device of FIG. 1.

As shown in FIG. 10, a deposited film 302P is formed by depositing silicon to cover trench TR with lower insulating film 201P being interposed therebetween. Deposited film 302P can be formed by the chemical vapor deposition (CVD) method, for example.

Figure 11:
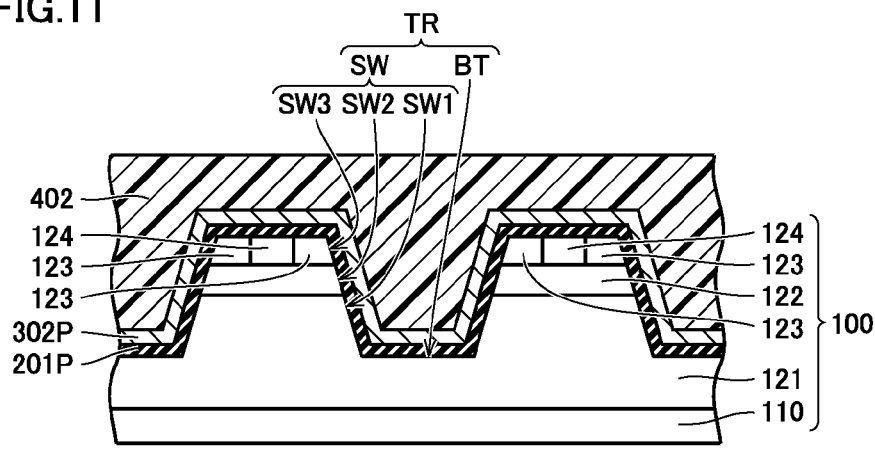
FIG. 11 is a partial cross sectional view schematically showing an eighth step of the method for manufacturing the silicon carbide semiconductor device of FIG. 1.

As shown in FIG. 11, a resist liquid is applied to fill trench TR with deposited film 302P and lower insulating film 201P being interposed therebetween. Accordingly, a resist layer 402 is formed.

Figure 12:
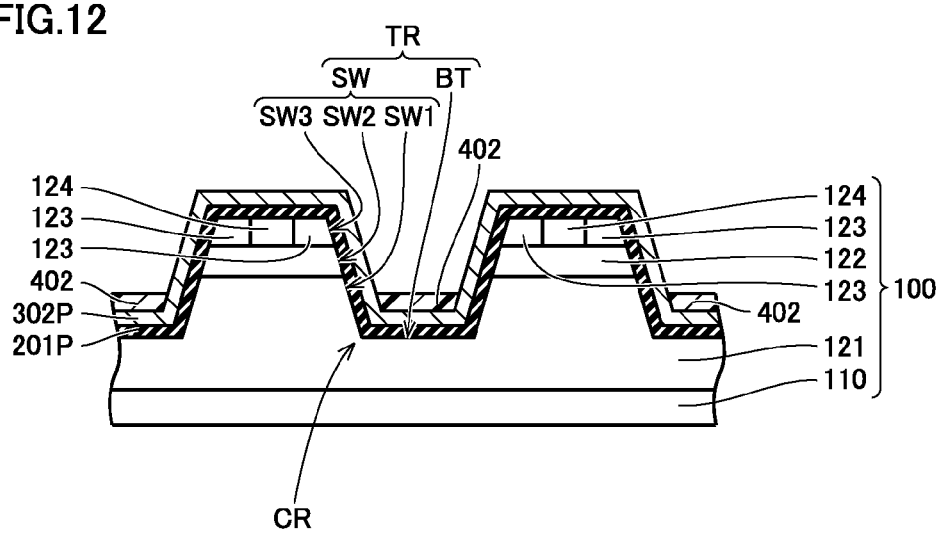
FIG. 12 is a partial cross sectional view schematically showing a ninth step of the method for manufacturing the silicon carbide semiconductor device of FIG. 1.

As shown in FIG. 12, by etching back resist layer 402, resist layer 402 is patterned such that resist layer 402 partially remains in trench TR. Resist layer 402 thus remaining covers a portion of deposited film 302P on corner portion CR with lower insulating film 201P being interposed therebetween. The etch back may be performed without using any etching mask. Next, after patterning resist layer 402, deposited film 302P is etched using resist layer 402 as a mask.

Figure 13:
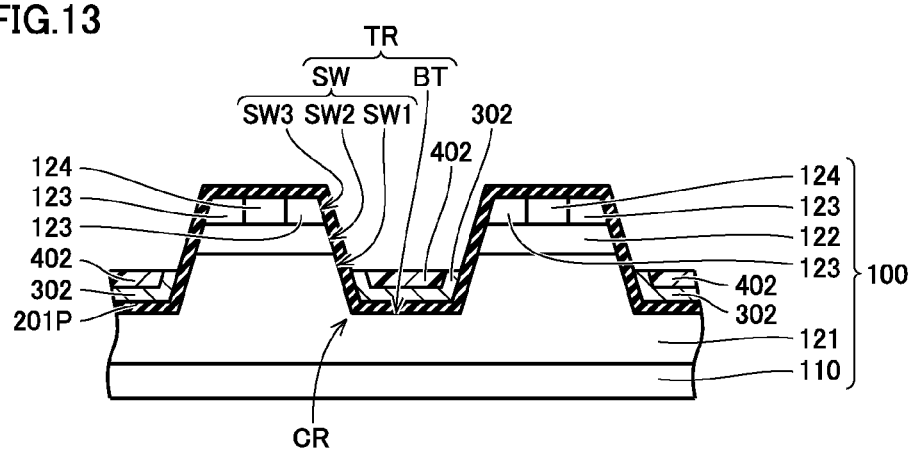
FIG. 13 is a partial cross sectional view schematically showing a tenth step of the method for manufacturing the silicon carbide semiconductor device of FIG. 1.
Figure 14:
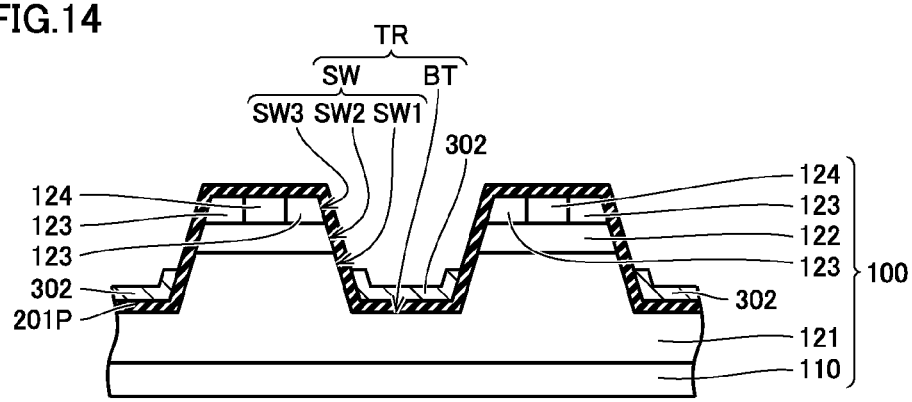
FIG. 14 is a partial cross sectional view schematically showing an eleventh step of the method for manufacturing the silicon carbide semiconductor device of FIG. 1.

As shown in FIG. 13, by the above-mentioned etching, a silicon film 302 is formed from deposited film 302P (FIG. 12). Silicon film 302 covers a portion of lower insulating film 201P on corner portion CR, and at least partially exposes a portion of lower insulating film 201P on side surface SW2. Next, resist layer 402 is removed (FIG. 14).

Figure 15:
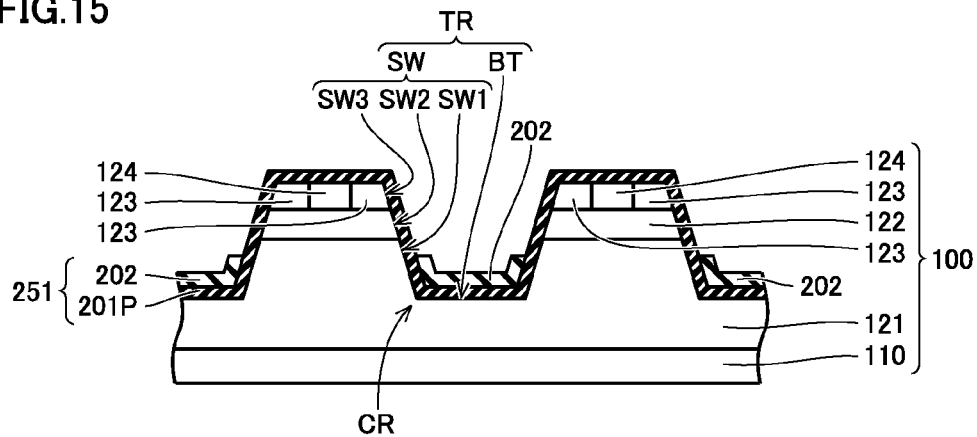
FIG. 15 is a partial cross sectional view schematically showing a twelfth step of the method for manufacturing the silicon carbide semiconductor device of FIG. 1.

As shown in FIG. 15, silicon film 302 (FIG. 14) is oxidized, thereby forming an upper insulating film 202 (second insulating film). Upper insulating film 202 covers a portion of insulating film 201P on corner portion CR, and at least partially exposes a portion of lower insulating film 201P on side surface SW2. In the present embodiment, upper insulating film 202 exposes the entire portion of lower insulating film 201P on side surface SW2. Silicon film 302 is oxidized by, for example, thermal oxidation at not less than 800° C. and not more than 950° C. In this way, a covering insulating film 251 having upper insulating film 202 and lower insulating film 201P is formed to cover trench TR.

Figure 16:
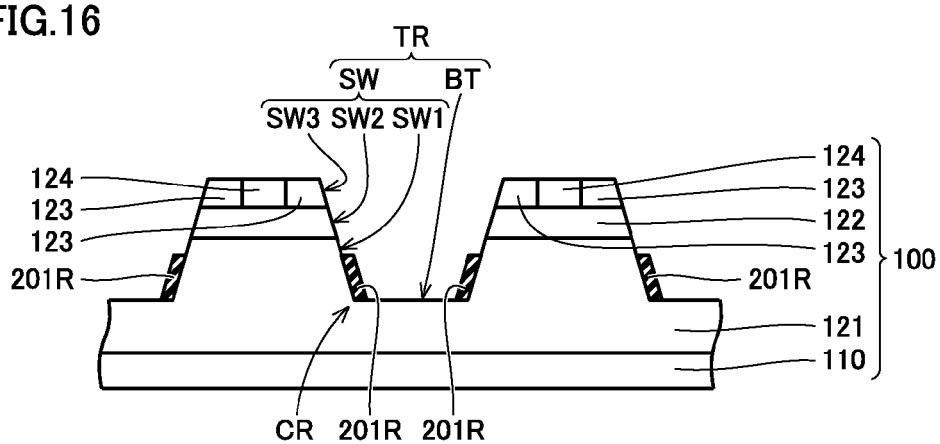
FIG. 16 is a partial cross sectional view schematically showing a thirteenth step of the method for manufacturing the silicon carbide semiconductor device of FIG. 1.

As shown in FIG. 16, covering insulating film 251 (FIG. 15) is etched back. Accordingly, a corner insulating film 201R is formed to cover corner portion CR and at least partially expose side surface SW2 of trench TR. Upon the etch back, a portion of bottom surface BT is preferably exposed. The etch back may be performed without using an etching mask. The etch back is preferably performed by wet etching. The wet etching can be performed using hydrofluoric acid, for example. Next, trench TR is thermally oxidized. Accordingly, gate insulating film 201 (FIG. 17) is formed.

Figure 18:
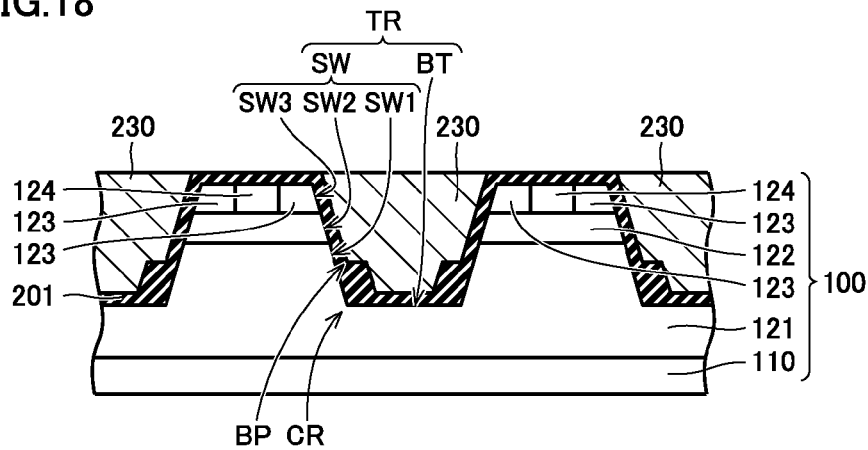
FIG. 18 is a partial cross sectional view schematically showing a fifteenth step of the method for manufacturing the silicon carbide semiconductor device of FIG. 1.

As shown in FIG. 18, gate electrode 230 is formed on trench TR with gate insulating film 201 being interposed therebetween. A method for forming gate electrode 230 can be performed by, for example, forming a film of conductor or doped polysilicon and performing CMP (Chemical Mechanical Polishing).

Referring to FIG. 1 again, interlayer insulating film 203 is formed on gate electrode 230 and gate insulating film 201 so as to cover the exposed surface of gate electrode 230. Etching is performed to form an opening in interlayer insulating film 203 and gate insulating film 201. Through the opening, each of n region 123 and contact region 124 is exposed on the upper surface of the mesa structure. Next, on the upper surface of the mesa structure, source electrode 221 is formed in contact with each of n region 123 and contact region 124. Source interconnection 222, drain electrode 211, and protecting electrode 212 are formed. In this way, MOSFET 501 is obtained.

According to the present embodiment, with $d_2 > d_1$ (FIG. 3), it is possible to control the gate at a low voltage and prevent dielectric breakdown of gate insulating film 201 in the vicinity of corner portion CR of trench TR. Moreover, with $d_2 > d_0$, bottom portion 201B of gate insulating film 201 has a portion thinner than thickness $d_2$, thereby suppressing the depletion layer from extending from bottom surface BT of trench TR to n⁻ layer 121. Thus, a degree of narrowing the current path in n⁻ layer 121 by this depletion layer can be reduced. Therefore, the on resistance of MOSFET 501, 502 can be reduced.

Moreover, when $d_0 > d_1$ is satisfied, bottom portion 201B of gate insulating film 201 does not have a portion formed to be too thin. Therefore, the dielectric breakdown of gate insulating film 201 can be prevented more securely.

Moreover, side wall portion 201S of gate insulating film 201 preferably connects n⁻ layer 121 and n region 123 to each other on side surface SW2 by a portion having a thickness less than thickness $d_2$. Accordingly, n⁻ layer 121 and n region 123 are connected to each other by a channel path facing gate electrode 230 with only a portion of gate insulating film 201 having a thickness less than thickness $d_2$ being interposed therebetween. Therefore, gate voltage necessary for gate control can be made lower.

Side wall portion 201S of gate insulating film 201 preferably connects n⁻ layer 121 and n region 123 to each other on side surface SW2 by the portion having thickness $d_1$. Accordingly, n⁻ layer 121 and n region 123 are connected to each other by the channel path facing gate electrode 230 with only a portion of gate insulating film 201 having thickness $d_1$ being interposed therebetween. Therefore, gate voltage necessary for gate control can be made lower.

The step of forming corner insulating film 201R (FIG. 16) preferably includes steps or forming covering insulating film 251 (FIG. 15) to cover trench TR; and etching back covering insulating film 251. Accordingly, corner insulating film 201R can be formed readily. Covering insulating film 251 is preferably etched back by wet etching. Accordingly, the etch back is performed by chemical etching rather than physical etching. Therefore, the etch back does not provide physical damage to epitaxial substrate 100.

Moreover, as shown in FIG. 15, as a portion of covering insulating film 251, upper insulating film 202 is preferably formed to cover a portion of lower insulating film 201P on corner portion CR and at least partially expose a portion of lower insulating film 201P on side surface SW2. Accordingly, there is formed covering insulating film 251 having a portion that is likely to remain as corner insulating film 201R after etch back.

Moreover, silicon film 302 is preferably etched using, as a mask, resist layer 402 patterned by the etch back (FIG. 11 and FIG. 12) (FIG. 13). Accordingly, silicon film 302 to serve as upper insulating film 202 can be patterned readily.

Second Embodiment

Figure 19:
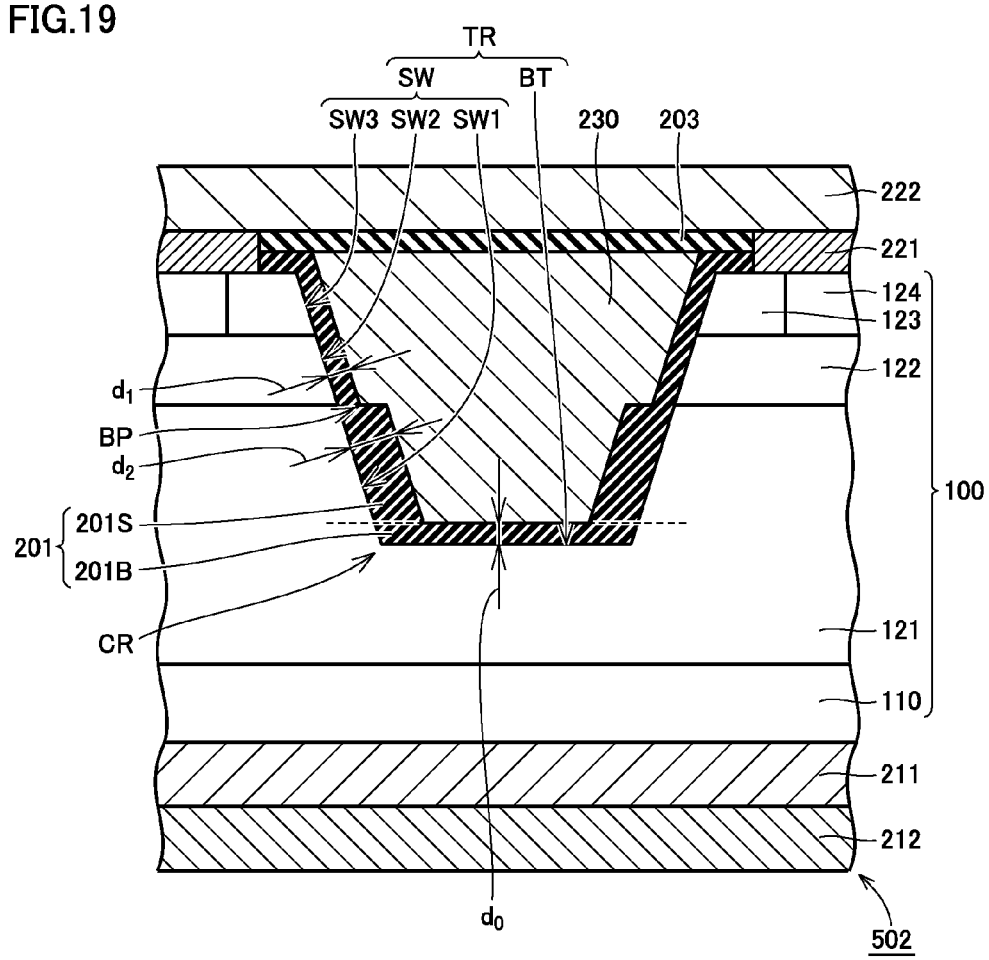
FIG. 19 is a partial cross sectional view schematically showing a configuration of a silicon carbide semiconductor device in a second embodiment of the present invention.

As shown in FIG. 19, in a MOSFET 502 (silicon carbide semiconductor device) of the present embodiment, unlike the first embodiment (FIG. 3), boundary portion BP is located on the boundary between side surfaces SW1 and SW2. The expression "located on the boundary" herein is intended to permit an error of specifically, about ±0.1 μm, rather than permitting no production error at all. Boundary portion BP can be positioned in this way by, for example, suppressing a degree of advance of the etch back step (FIG. 11 and FIG. 12) in the first embodiment. Apart from the configuration described above, the configuration of the present embodiment is substantially the same as the configuration of the first embodiment. Hence, the same or corresponding elements are given the same reference characters and are not described repeatedly.

By positioning boundary portion BP as described above, side wall portion 201S of gate insulating film 201 connects between p type body layer 122 and bottom portion 201B on side surface SW1 by a portion having a thickness more than thickness $d_1$. Accordingly, the portion of side wall portion 201S on side surface SW1 has a thickness more than thickness $d_1$ in a wider range. Therefore, the dielectric breakdown of gate insulating film 201 can be prevented more securely in the vicinity of corner portion CR of trench TR.

Side wall portion 201S of gate insulating film 201 may connect between p type body layer 122 and bottom portion 201B on side surface SW1 by a portion having thickness $d_2$. Accordingly, the portion of side wall portion 201S on side surface SW1 has a thickness $d_2$ more than each of thicknesses $d_0$ and $d_1$ in a wider range. Therefore, the dielectric breakdown of gate insulating film 201 can be prevented more securely in the vicinity of corner portion CR of trench TR.

Third Embodiment

In a method for manufacturing a silicon carbide semiconductor device in the present embodiment, the same steps as those of the first embodiment in FIG. 4 to FIG. 8 are performed first.

Figure 20:
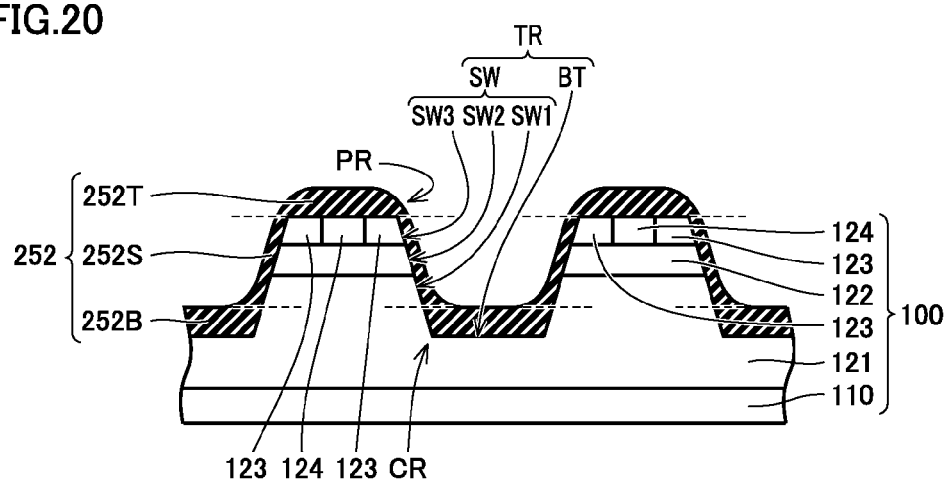
FIG. 20 is a partial cross sectional view schematically showing one step of a method for manufacturing a silicon carbide semiconductor device in a third embodiment of the present invention.

Next, as shown in FIG. 20, a covering insulating film 252 is formed to include: a bottom portion 252B located on bottom surface BT; a side wall portion 252S located on side wall surface SW so as to be connected to bottom portion 252B; and a surface portion 252T covering epitaxial substrate 100 outside trench TR. The step of forming covering insulating film 252 is performed by forming a thermal oxidation film on trench TR such that side wall portion 252S has the maximum thickness at its location connected to bottom portion 252B. This thermal oxidation film is preferably formed by thermal oxidation at a temperature of less than 1300° C.

Figure 17:
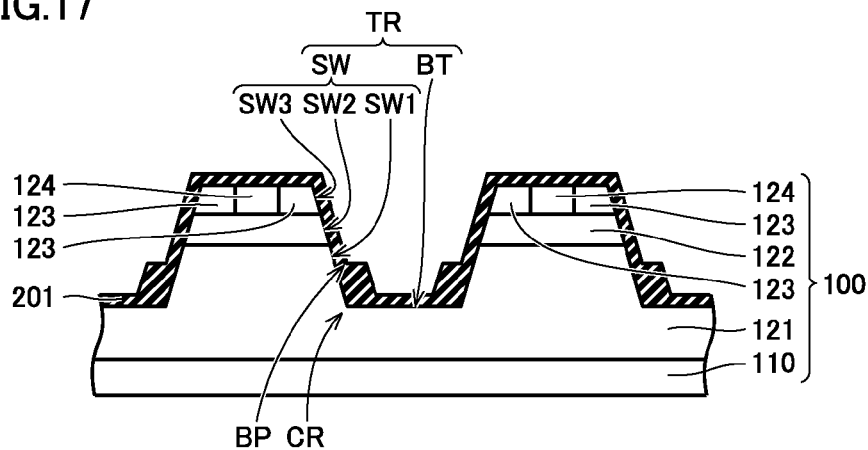
FIG. 17 is a partial cross sectional view schematically showing a fourteenth step of the method for manufacturing the silicon carbide semiconductor device of FIG. 1.

Next, covering insulating film 252 is etched back in substantially the same manner as the etch back of covering insulating film 251 (FIG. 15) in the first embodiment. Accordingly, corner insulating film 201R (FIG. 16) is formed. After this, the steps of FIG. 17 and FIG. 18 are performed in substantially the same manner as in the first embodiment, thereby obtaining MOSFET 501 (FIG. 1).

According to the present embodiment, covering insulating film 252 having a portion that is likely to remain as corner insulating film 201R after etch back can be formed readily using thermal oxidation.

Surface Having Special Plane

Figure 21:
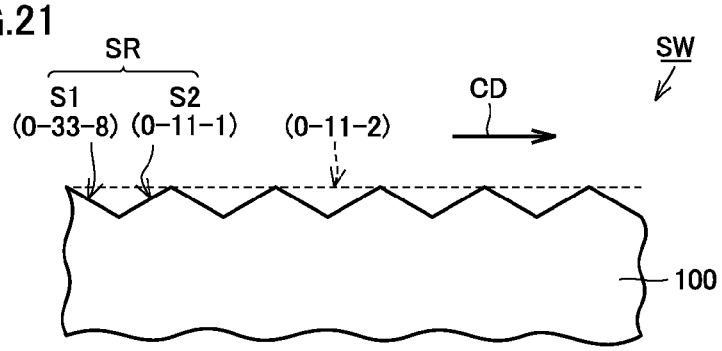
FIG. 21 is a partial cross sectional view schematically showing a fine structure in a surface of the silicon carbide substrate included in the silicon carbide semiconductor device.

As described above, side wall surface SW (FIG. 3) of trench TR, in particularly, side surface SW2 preferably has a predetermined crystal plane (also referred to as "special plane"). Such a side wall surface SW includes a plane S1 (first plane) having a plane orientation of {0-33-8} as shown in FIG. 21. Plane S1 preferably has a plane orientation of (0-33-8).

More preferably, side wall surface SW microscopically includes plane S1, and further microscopically includes a plane S2 (second plane) having a plane orientation of {0-11-1}. Here, the term "microscopically" refers to "minutely to such an extent that at least the size about twice as large as an interatomic spacing is considered". As a method for observing such a microscopic structure, for example, a TEM (Transmission Electron Microscope) can be used. Plane S2 preferably has a plane orientation of (0-11-1).

Preferably, plane S1 and plane S2 of side wall surface SW constitute a combined plane SR having a plane orientation of {0-11-2}. Specifically, combined plane SR is formed of periodically repeated planes S1 and S2. Such a periodic structure can be observed by, for example, TEM or AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, in the channel surface, carriers flow in a channel direction CD, in which the above-described periodic repetition is done.

Next, a detailed structure of combined plane SR will be illustrated.

Figure 22:
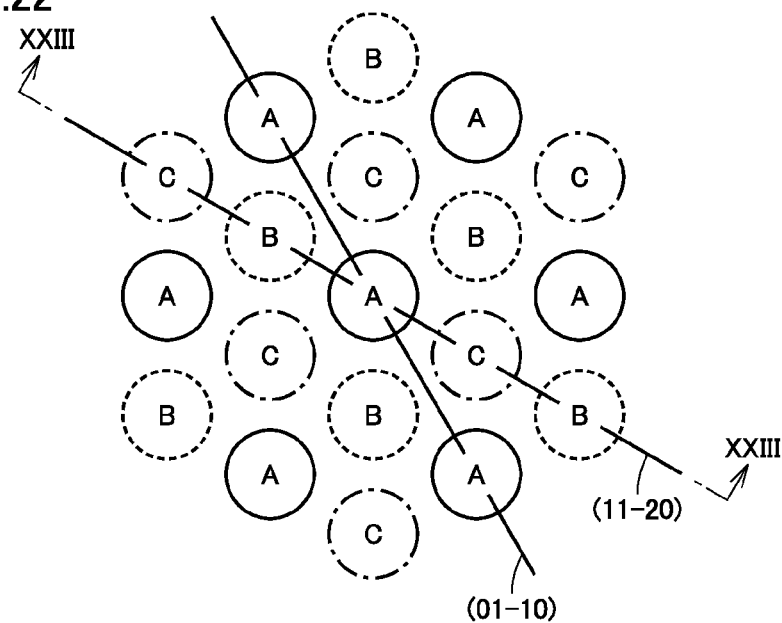
FIG. 22 shows a crystal structure of a (000-1) plane in a hexagonal crystal of polytype 4H.

Generally, regarding Si atoms (or C atoms), when viewing a silicon carbide single-crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 22. In other words, with four layers ABCB being regarded as one period, a periodic stacking structure such as ABCBABCBABCB . . . is provided.

Figure 23:
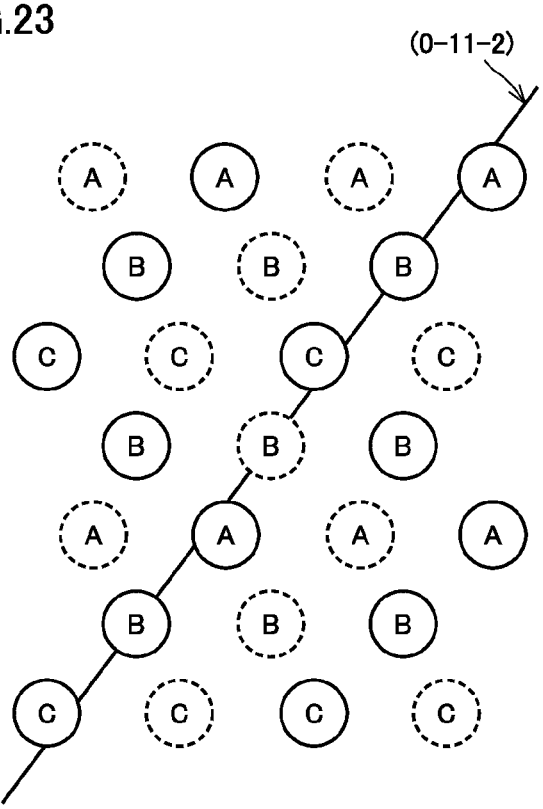
FIG. 23 shows a crystal structure of a (11-20) plane along a line XXIII-XXIII of FIG. 22.

As shown in FIG. 23, in the (11-20) plane (cross section taken along a line XXIII-XXIII of FIG. 22), atoms in each of four layers ABCB constituting the above-described one period are not aligned completely along the (0-11-2) plane. In FIG. 23, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single-crystal, i.e., the plane orientation thereof with its atomic level structure being ignored is limited to (0-11-2), this surface can have various structures microscopically.

Figure 24:
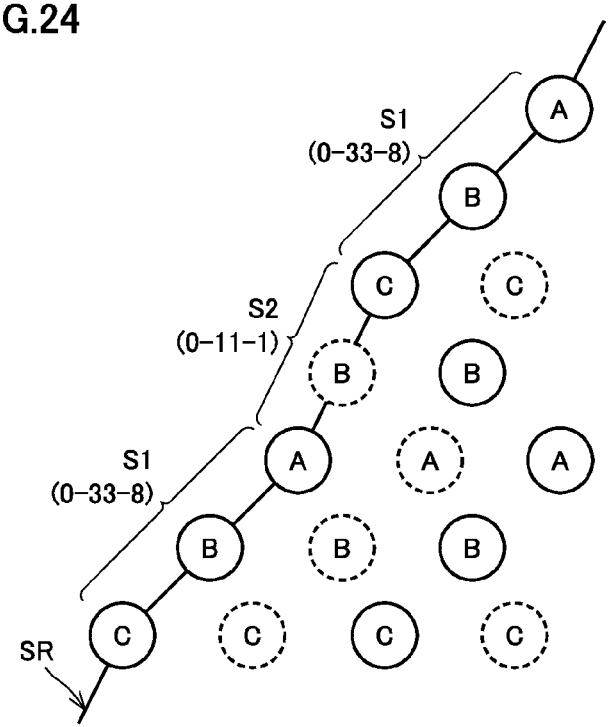
FIG. 24 shows a crystal structure in the vicinity of a surface with a combined plane of FIG. 21 within a (11-20) plane.

As shown in FIG. 24, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 23).

Figure 25:
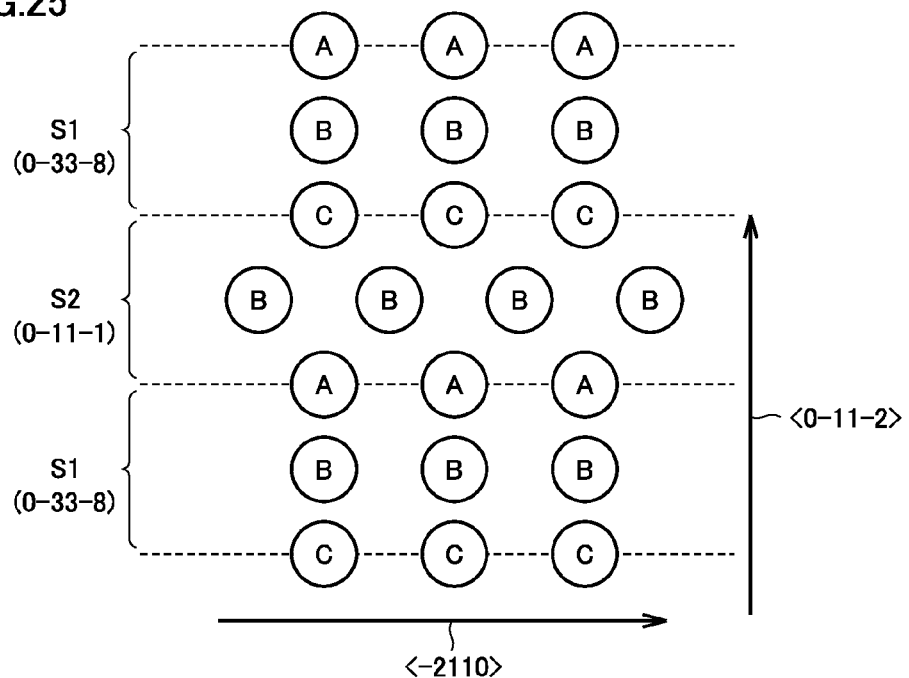
FIG. 25 shows the combined plane of FIG. 21 when viewed from a (01-10) plane.

As shown in FIG. 25, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 25) having a plane orientation of (001) in the structure equivalent to the cubic structure and the planes (planes S2 in FIG. 25) connected to the foregoing planes and having a plane orientation different from that of each of the foregoing planes. The polytype may be 6H or 15R, for example.

Figure 26:
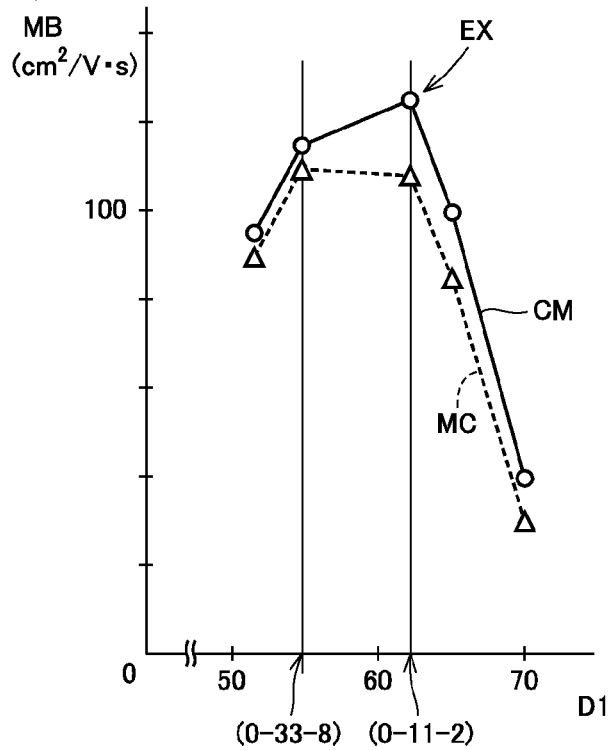
FIG. 26 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 26, the following describes a relation between the crystal plane of side wall surface SW and mobility MB of the channel surface. In the graph of FIG. 26, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to a special plane by thermal etching, whereas a group of plots MC correspond to a case where side wall SW is not thermally etched.

In group of plots MC, mobility MB is at maximum when the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 24 and FIG. 25, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 27:
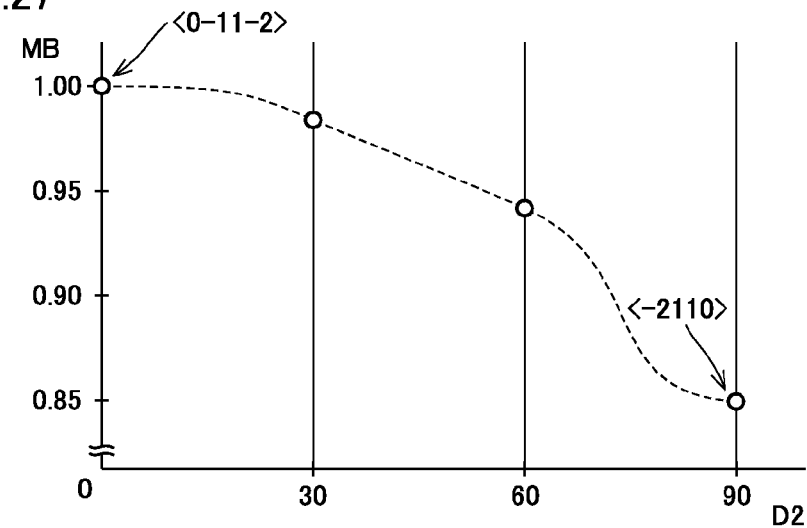
FIG. 27 is a graph showing an exemplary relation between the channel mobility and an angle between a channel direction and a <0-11-2> direction.

It should be noted that mobility MB has orientation dependency on combined plane SR. In a graph shown in FIG. 27, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 21) preferably has an angle D2 of not less than 0° and not more than 60°, more preferably, substantially 0°.

Figure 28:
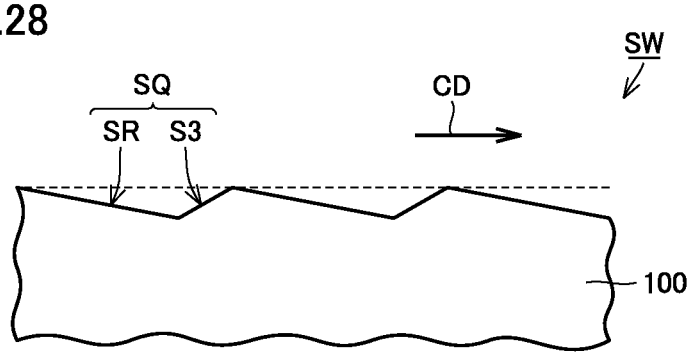
FIG. 28 shows a modification of FIG. 21.

As shown in FIG. 28, side wall surface SW may further include plane S3 (third plane) in addition to combined plane SR. More specifically, side wall surface SW may include a combined plane SQ constituted of periodically repeated plane S3 and combined plane SR. In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed by TEM or AFM, for example.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims. For example, the silicon carbide semiconductor device may be a MISFET (Metal Insulator Semiconductor Field Effect Transistor) other than the MOSFET. Further, the silicon carbide semiconductor device is not limited to the MISFET, and may be, for example, an IGBT (Insulated Gate Bipolar Transistor). Moreover, the first and second conductivity types are not limited to the n type and the p type respectively but may be replaced with each other.

REFERENCE SIGNS LIST

100: epitaxial substrate (silicon carbide substrate); 110: single-crystal substrate; 121: n⁻ layer 121 (first semiconductor layer); 122: p type body layer (second semiconductor layer); 123: n region (third semiconductor layer); 124: contact region; 201: gate insulating film; 201P: lower insulating film (first insulating film); 202: upper insulating film (second insulating film); 201B: bottom portion; 201P: lower insulating film (first insulating film); 201S: side wall portion; 202: upper insulating film (second insulating film); 203: interlayer insulating film; 211: drain electrode; 212: protecting electrode; 221: source electrode; 222: source interconnection; 230: gate electrode; 251, 252: covering insulating film; 252B: bottom portion; 252S: side wall portion; 252T: surface portion; 302: silicon film; 302P: deposited film; 401: mask; 402: resist layer; 501, 502: MOSFET (silicon carbide semiconductor device); BT: bottom surface; CR: corner portion; SW: side wall surface; SW1 to SW3: first to third side surfaces; TR: trench.

The invention claimed is:

1. A method for manufacturing a silicon carbide semiconductor device comprising steps of:
   preparing a silicon carbide substrate including a first semiconductor layer, a second semiconductor layer, and a third semiconductor layer, said first semiconductor layer having a first conductivity type, said second semiconductor layer being provided on said first semiconductor layer, said second semiconductor layer having a second conductivity type, said third semiconductor layer being provided on said second semiconductor layer, said third semiconductor layer being separated from said first semiconductor layer by said second semiconductor layer, said third semiconductor layer having said first conductivity type;
   forming a trench in said silicon carbide substrate, said trench including a bottom surface and a side wall surface, said bottom surface being constituted of said first semiconductor layer, said side wall surface having first to third side surfaces respectively constituted of said first to third semiconductor layers, said trench having a corner portion formed by said first side surface and said bottom surface meeting each other;
   forming a gate insulating film on said trench, said gate insulating film having a bottom portion and a side wall portion, said bottom portion covering said bottom surface, said side wall portion being connected to said bottom portion, said side wall portion covering said side wall surface, said bottom portion having a minimum thickness $d_0$, a portion of said side wall portion on said second side surface having a minimum thickness $d_1$, said side wall portion having a portion that is connected to said bottom portion on said first side surface and that has a thickness $d_2$, $d_2 > d_1$ and $d_2 > d_0$ being satisfied, the step of forming said gate insulating film including steps of forming a corner insulating film to cover said corner portion and at least partially expose said second side surface of said trench and thermally oxidizing said trench after forming said corner insulating film; and
   forming a gate electrode on said trench with said gate insulating film being interposed therebetween;
   wherein the step of forming said corner insulating film includes steps of:
      forming a covering insulating film to cover said trench; and
      etching back said covering insulating film;
   wherein the step of forming said covering insulating film includes steps of:
      forming a first insulating film on said trench; and
      forming, after the step of forming said first insulating film, a second insulating film to cover a portion of said first insulating film on said corner portion and at least partially expose a portion of said first insulating film on the second side surface; and
   wherein the step of forming said second insulating film includes steps of:
      forming, after the step of forming said first insulating film, a silicon film to cover a portion of said first insulating film on the corner portion and at least partially expose a portion of said first insulating film on the second side surface; and
      oxidizing said silicon film.

2. The method for manufacturing the silicon carbide semiconductor device according to claim 1, wherein the step of etching back said covering insulating film is performed by wet etching.

3. The method for manufacturing the silicon carbide semiconductor device according to claim 1, wherein
   the step of forming said silicon film includes steps of:
      forming a deposited film to cover said trench by depositing silicon;

forming a resist layer by applying a resist liquid to fill said trench with said deposited film being interposed therebetween;

patterning said resist layer by etching back said resist layer such that said resist layer partially remains in said trench; and etching said deposited film using said resist layer as a mask after the step of patterning said resist layer.

4. A method for manufacturing a silicon carbide semiconductor device comprising steps of:

preparing a silicon carbide substrate including a first semiconductor layer, a second semiconductor layer, and a third semiconductor layer, said first semiconductor layer having a first conductivity type, said second semiconductor layer being provided on said first semiconductor layer, said second semiconductor layer having a second conductivity type, said third semiconductor layer being provided on said second semiconductor layer, said third semiconductor layer being separated from said first semiconductor layer by said second semiconductor layer, said third semiconductor layer having said first conductivity type;

forming a trench in said silicon carbide substrate, said trench including a bottom surface and a side wall surface, said bottom surface being constituted of said first semiconductor layer, said side wall surface having first to third side surfaces respectively constituted of said first to third semiconductor layers, said trench having a corner portion formed by said first side surface and said bottom surface meeting each other;

forming a gate insulating film on said trench, said gate insulating film having a bottom portion and a side wall portion, said bottom portion covering said bottom surface, said side wall portion being connected to said bottom portion, said side wall portion covering said side wall surface, said bottom portion having a minimum thickness $d_0$, a portion of said side wall portion on said second side surface having a minimum thickness $d_1$, said side wall portion having a portion that is connected to said bottom portion on said first side surface and that has a thickness $d_2$, $d_2 > d_1$ and $d_2 > d_0$ being satisfied, the step of forming said gate insulating film including steps of forming a corner insulating film to cover said corner portion and at least partially expose said second side surface of said trench and thermally oxidizing said trench after forming said corner insulating film; and forming a gate electrode on said trench with said gate insulating film being interposed therebetween;

wherein the step of forming said corner insulating film includes steps of:

forming a covering insulating film to cover said trench; and etching back said covering insulating film; and wherein said covering insulating film has a bottom portion and a side wall portion, said bottom portion being located on said bottom surface, said side wall portion being located on said side wall surface so as to be connected to said bottom portion, and the step of forming said covering insulating film is performed by forming a thermal oxidation film on said trench such that said side wall portion has a maximum thickness at a location connected to said bottom portion.

5. The method for manufacturing the silicon carbide semiconductor device according to claim 4, wherein the step of forming said thermal oxidation film is performed by thermal oxidation at a temperature of less than 1300° C.

\* \* \* \* \*